United States Patent
Jin

(10) Patent No.: US 7,301,848 B2
(45) Date of Patent: Nov. 27, 2007

(54) APPARATUS AND METHOD FOR SUPPLYING POWER IN SEMICONDUCTOR DEVICE

(75) Inventor: Seung Eon Jin, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/875,598

(22) Filed: Jun. 24, 2004

(65) Prior Publication Data

US 2005/0232052 A1    Oct. 20, 2005

(30) Foreign Application Priority Data

Apr. 20, 2004    (KR) ...................... 10-2004-0027101

(51) Int. Cl.
*G11C 5/14*    (2006.01)
(52) U.S. Cl. .................................. 365/226; 365/189.11
(58) Field of Classification Search ........... 365/189.11, 365/226; 327/172–174
See application file for complete search history.

(56) References Cited

U.S. PATENT DOCUMENTS

| | | | |
|---|---|---|---|
| 6,011,746 A | * | 1/2000 | Oh .......................... 365/230.06 |
| 6,437,468 B2 | * | 8/2002 | Stahl et al. .................. 375/285 |
| 6,724,679 B2 | * | 4/2004 | Nagasawa et al. ..... 365/230.03 |
| 6,906,970 B2 | * | 6/2005 | Kim et al. .................... 365/201 |
| 6,937,535 B2 | * | 8/2005 | Ahn et al. .................... 365/222 |

FOREIGN PATENT DOCUMENTS

| KR | 1020030002079 A | | 1/2003 |
|---|---|---|---|
| KR | 1020030002079 | * | 8/2003 |

* cited by examiner

*Primary Examiner*—Amir Zarabian
*Assistant Examiner*—Anthan T Tran
(74) *Attorney, Agent, or Firm*—Marshall, Gerstein & Borun LLP

(57) ABSTRACT

Provided is directed to an apparatus and method of supplying power in a semiconductor memory device which supplies an external voltage of high level at the beginning operation which current consumption is rapidly increased and then supplies an internal voltage of a target level, but the external voltage is supplied for a longer time in case that the current consumption is increased more when plural pairs of bitlines are selected than when a pair of bitlines is selected, and thus the apparatus comprises the relatively small number of internal voltage generators and also it is capable of improving reliability of a circuit operation.

1 Claim, 2 Drawing Sheets

APPARATUS AND METHOD FOR SUPPLYING POWER IN SEMICONDUCTOR DEVICE

This application relies for priority upon Korean Patent Application No. 2004-0027101 filed on Apr. 20, 2004, the contents of which are herein incorporated by reference in their entirety.

BACKGROUND

1. Field of the Invention

The present invention relates to an apparatus and method for supplying power in a semiconductor memory device, and more particularly, to an apparatus and method for supplying power in a semiconductor memory device, capable of controlling voltage supplying time in accordance with power consumption.

2. Discussion of Related Art

Most circuits use an apparatus for supplying power. An apparatus for supplying power used in a memory device thereof will be described as follows.

A sense amplifier included in a semiconductor memory device is used for many objects, and it is also used to amplify voltage difference of a pair of bitlines. Especially, in DRAM, the sense amplifier amplifies the voltage difference of a pair of bitlines, performing a data read/write operation and a data refresh operation of a memory cell. Thus, many operations of the sense amplifier are controlled by an additional sense amplifier control circuit.

In other words, as a semiconductor memory device has been integrated higher and used lower power, and an operation voltage has been lower, there has been studied about technical assistance to stand by the operation of the sense amplifier of the memory device, of which is a method of overdriving of the sense amplifier.

In a pull-up operation from a precharge voltage to an internal voltage, the internal voltage is generally lower. Here, because there is not much differences between the internal voltage and the precharge voltage, it takes long time to rise up the internal voltage to a target level (the internal voltage). To overcome the problem, an external voltage which is relatively high level is supplied by an apparatus for supplying power during a predetermined period, which is called as an overdriving.

For more detailed description, when the sense amplifier is activated, a relatively high external voltage (i.e., 3.3V) is supplied to improve data sensing speed of the sense amplifier, and then an internal voltage (i.e., 2.2V) is supplied to maintain the voltage of the sense amplifier.

During this, an apparatus for supplying power is necessary to supply the external voltage only during a predetermined period. Accordingly, it will be described about a structure or an operation of an apparatus for supplying power in accordance with the conventional technique as follows.

FIG. 1 is a schematic diagram of a circuit illustrating an apparatus of supplying power in accordance with the conventional art.

Referring to FIG. 1, an power supply apparatus 100 is comprised of a pulse generator 110 and an internal voltage generator 120 for applying a relatively high external voltage VDD to a sense amplifier 130 for a predetermined period (hereinafter, referred to as 'overdriving period) at the beginning operation, and then for supplying an internal voltage Vcore.

In the aforementioned FIG. 1, the pulse generator 110 is operated by an enable signal ACT which becomes high level when an active command is inputted, and generates an overdriving signal ovdb only during the overdriving period. As a result, it leads a switching device P10 connected to an external voltage terminal to be turned on. When the switching device P10 is turned on, the external voltage VDD is supplied to the sense amplifier 130 only during the overdriving period.

During this state, the external voltage VDD is applied to the sense amplifier 130 which is selected by first and second sense amp driving signal SAP1 and SAN1. According to this, a voltage precharged to an input terminal of the sense amplifier 130 begins to rise in a rapid speed.

And then, when the overdriving period is completed, the switching device P101 is turned off by the overdriving signal ovdb of the pulse generator 110. As a result, the sense amplifier 130 is applied the internal voltage Vcore generated from the internal voltage generator 120, instead of the external voltage VDD. During the aforementioned operation, when a pair of bitlines is selected, power consumption is not much, so that there is no problem. However, when the n-numbered pair of bitlines is selected such as a refresh operation, current consumption is increased more than n times.

Therefore, in the refresh operation, because the currents are consumed a lot at a completing timing of the overdriving period, if the external voltage VDD is not supplied and a relatively low internal voltage is supplied at the completing timing of the overdriving period, there is not a normal operation performed.

In order to solve the aforementioned problems, during the refresh operation, a plurality of internal voltage generators should be operated, and also should be comprised of a plurality of internal voltage generators in the power supply apparatus 100. It accordingly causes other problems.

SUMMARY OF THE INVENTION

The present invention is directed to an apparatus and method for supplying power in a semiconductor memory device supplying an external voltage of high level at the beginning when current consumption is remarkably increased, and then supplying an internal voltage of a target level. During this, when the current consumption is increased more due to selecting plural pairs of bitlines than selecting a pair of bitlines, the external voltage is supplied. Accordingly, although the relatively small number of internal voltage generators are included and operated, it is available to improve reliability of an operation of circuit thereby.

One aspect of the present invention is to provide an apparatus of supplying power in a semiconductor memory device, including: an internal voltage generator for generating an internal operation voltage and then outputting it to an output terminal; a pulse generator for generating a first pulse signal having a first pulse width when going into an operating mode requiring a first current consumption by a control signal, and generating a second pulse signal having a second pulse width when going into an operating mode requiring a second current consumption, wherein the first pulse width of the first pulse signal is wider than that of the second pulse signal, and the first current consumption is greater than the second current consumption; a switching device for transferring an external power source voltage to the output terminal by an output signal of the pulse generator.

Here, a refresh operation signal may be used as a control signal.

The pulse generator generates a pulse signal in response of applying an enable signal which becomes high level in response of inputting an active command signal.

The pulse generator is comprised of a first inverter for inverting the control signal, a first pulse generator for generating the pulse signal with a first pulse width in accordance with an output signal of the first inverter and the enable signal, a second pulse generator for generating a pulse signal with a second pulse width wider than the first pulse width in accordance with the control signal and the enable signal. Here, the pulse generator may include a NAND gate of which output terminals of the first and second pulse generators are connected to its input terminal, respectively, and a second inverter for inverting the output signal of the NAND gate.

The first pulse generator is comprised of a reverse delay unit for inverting the enable signal with delay, a second NAND gate to which the enable signal, an output signal of the reverse delay unit, and the output signal of the first inverter are inputted. Here, the reverse delay unit delays the enable signal as wide as the width of the first pulse.

The second pulse generator is comprised of a second reverse delay unit for inverting the enable signal with delay, a third NAND gate to which the enable signal, the output signal of the reverse delay unit, and the control signal are inputted. Here, the second reverse delay unit delays the enable signal as wide as the width of the second pulse.

Meanwhile, a switch device may be embodied with a PMOS transistor.

A method for supplying power in a semiconductor memory device, according to an embodiment of the present invention, supplies a high voltage of high level at the beginning of the circuit operation, and then supplies a low voltage of a target level when it is stabilized. While this, a supply time of the high voltage of high level is controlled by values of current consumption of the beginning of the circuit operation.

The method of supplying power in the semiconductor memory device according to another embodiment of the present invention includes steps of: deciding an operating mode according to a control signal; applying an external voltage of a first level for a first predetermined time and applying an internal voltage of a target level after the first predetermined time in case of an operating mode requiring relatively more current consumption; and applying the external voltage for a second predetermined time and applying the second voltage after second predetermined time in case of an operating mode requiring relatively low current consumption, wherein the first level is higher than the target level, and the first predetermined time is longer than the second predetermined time.

In the aforementioned description, a control signal is a refresh operation signal, and the operating mode requiring much values of current consumption many be a refresh operating mode.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to drawings in detail.

Figure 1:
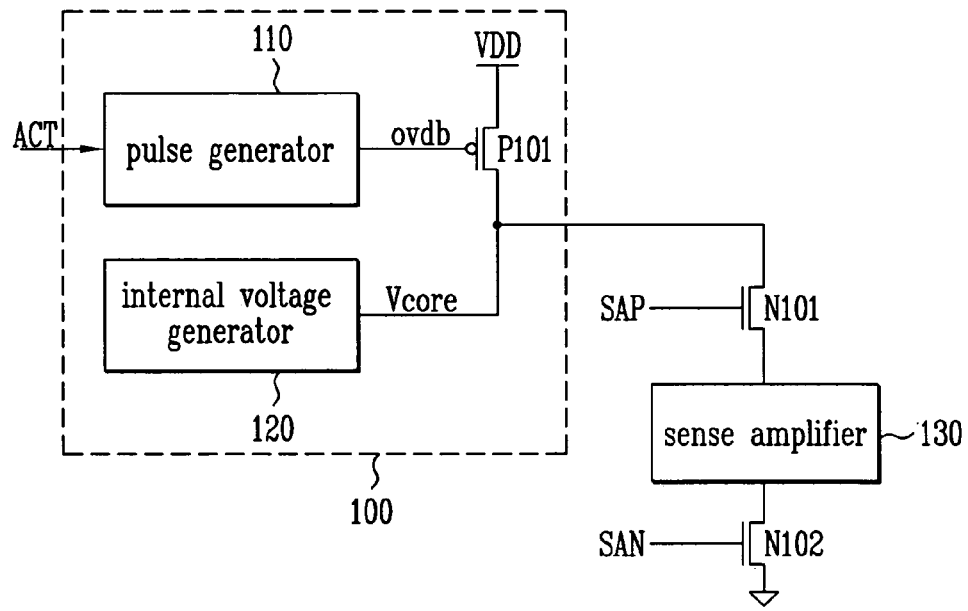
FIG. 1 is a schematic diagram of a circuit illustrating an apparatus of supplying power in accordance with the conventional art.
Figure 2:
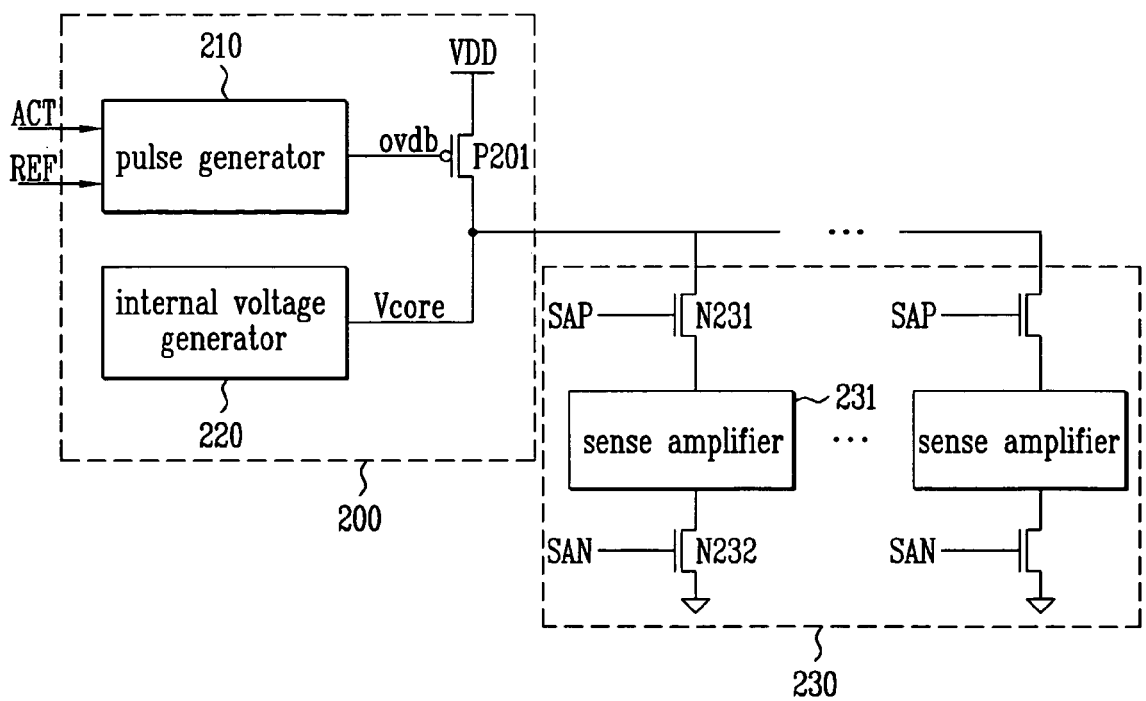
FIG. 2 is a schematic diagram of a circuit illustrating an apparatus of supplying power for a semiconductor memory device in accordance with the present invention.

FIG. 2 is a schematic diagram of a circuit illustrating an apparatus of supplying power for a semiconductor memory device in accordance with the present invention.

Referring to FIG. 2, the power supply apparatus 200 in the semiconductor memory device according to an embodiment of the present invention applies a relatively high external voltage VDD while a peripheral circuit 230 operates during a predetermined period (hereinafter, referred to as 'overdriving period) at the beginning. Moreover, after completing the overdriving period, the supplying of external voltage VDD is prohibited and a target potential of an internal voltage Vcore is supplied. At this time, the power supply apparatus 200 of the present invention differentiates supplying time of the external voltage VDD according to a signal (hereinafter, referred to as a control signal REF) capable of deciding values of current consumption of the peripheral circuit 230. That is, if the circuit operation is decided as being stabilized by reducing the current consumption according to the control signal REF, the external voltage VDD is supplied for a short time. Contrarily, if the current is decided as being consumed relatively much, the external voltage VDD is supplied for a long time.

The power supply apparatus 200 can be embodied with a pulse generator 210, a switching device P201, and an internal voltage generator 220.

Here, the pulse generator 210 is enabled by an enable signal ACT which is being active (or which becomes high level) in response of inputting an active command, and generates a different width of a pulse signal ovdb by the control signal REF.

The switching device P201 is connected between an external power source voltage terminal and an output terminal, and switches the external voltage VDD to an output terminal in accordance with the pulse signal ovdb which is generated from the pulse generator 210.

The internal voltage generator 220 generates an internal voltage Vcore of lower level than level of the external voltage VDD. The internal voltage generator 220 is generally used in a low power source device which is operated in a low voltage.

Hereinafter, it will be described about the power supply apparatus 200 when the peripheral circuit 230 is comprised of a plurality of bitlines and a sense amplifier 231 in a DRAM.

In the DRAM, currents are consumed much more when plural pairs of bitlines are selected than when a pair of bitlines is selected during a refresh operation. Therefore, when a short overdriving period is set to, the internal voltage which has relatively low level is supplied before the circuit operation is stabilized, which results in unstable operation of the circuit. On the other side, in a normal mode which doesn't consume currents much, if a long overdriving period is set to, the power consumption is increased unnecessarily and also it is disadvantageous for the circuit.

Accordingly, the power supply apparatus 200 of the present invention supplies the external voltage VDD for a relatively long time only when the refresh operation is performed. A supplying time is adjustable by a delay time of a delay unit included in the power supply apparatus 200. While this, the refresh operation signal is available to be used as the control signal REF, capable of deciding much or less of values of current consumption.

In this condition, when the refresh operation signal is applied as the control signal REF, the power supply apparatus 200 sets to a long overdriving period or a short overdriving period in accordance with the control signal REF. Thereof, the external voltage VDD is supplied for a long time or a short time. Voltages VDD or Vcore which are supplied from the power supply apparatus 200 are applied to the selected sense amplifier 231 by first and second sense amp driving signal SAP and SAN. As a result, the external voltage VDD is supplied for a sufficient time until the circuit is stabilized, and thus it can increase input terminals of the sense amplifiers 231 included in the peripheral circuit 230 in a rapid speed.

As aforementioned, in order to control the supplying time of the external voltage VDD, the width of the pulse signal ovdb should be generated differently, according to values of current consumption. It will be explained about a structure or an operation of the pulse generator 210 as mentioned early in more detail as follows.

Figure 3:
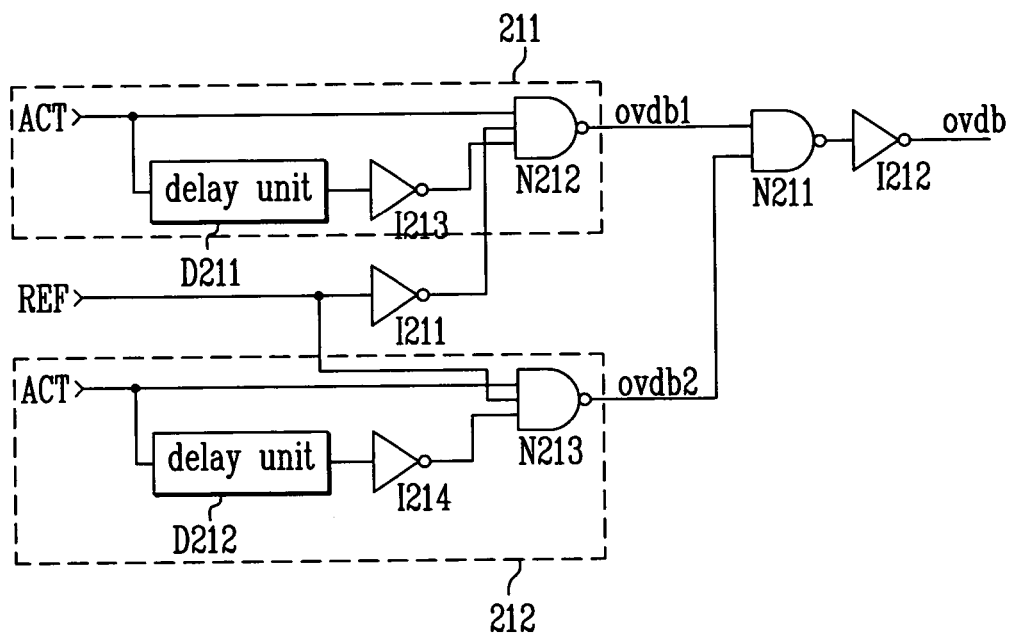
FIG. 3 is a circuit diagram illustrating a pulse generator of FIG. 2.

FIG. 3 is a circuit diagram illustrating the pulse generator of FIG. 2.

Referring to FIG. 3, the pulse generator is comprised of a first pulse generator 211 and a second pulse generator 212, for generating different widths of pulse signals ovdb1 or ovdb2, and an inverter I211 for inverting the control signal REF.

The first pulse generator 211 generates the first pulse signal ovdb1 by means of the control signal REF which is inverted by the inverter I211 and the enable signal ACT. This first pulse generator 211 can be comprised of a reverse delay means which include a delay unit D211 and an inverter I213, and a NAND gate N212.

The reverse delay means D211 and I213 inverts the enable signal ACT after delaying for a predetermined time. The enable signal ACT, an output of the reverse delay means D211 and I213, and the inverted control signal REF are all inputted to the NAND gate N212. At this time, when the enable signal ACT inputted to the NAND gate N212 and the inverted control signal REF are high level, the pulse generator 211 is normally operated. In this condition, if the enable signal ACT of high level is inputted to the NAND gate N212 and the reverse enable signal ACT by a predetermined time difference is also inputted to the NAND gate N212, the NAND gate N212 generates the first pulse signal ovdb1 to low level by a predetermined time. While this, a time delayed by the delay unit D211 becomes the pulse width of the first pulse signal ovdb1.

On the other hand, while the first pulse generator 211 operates, the second pulse generator 212 doesn't operate by being disabled due to the control signal REF. The first pulse signal ovdb1 generated from the first pulse generator 211 is outputted as the pulse signal ovdb through the NAND gate N212 and the inverter I212.

The second pulse generator 212 is comprised as the same structure to the first pulse generator 211. However, it is different that the control signal REF is inputted directly to a NAND gate N213 without passing through the inverter I211 and further for the extent of delay by the delay means D212. Thereby, when the first pulse generator 211 doesn't operate, the second pulse generator 212 operates. Furthermore, the second pulse generator 212 generates the second pulse signal ovdb2 with a different pulse width from the first pulse signal ovdb1 generated from the first pulse generator 211. When the second pulse signal ovdb2 is generated from the second pulse generator 212, the second pulse signal ovdb2 is outputted as the pulse signal ovdb through the NAND gate N211 and the inverter I212 as the first pulse signal ovdb1 is thereto.

In the aforementioned description, assuming that the width of the second pulse signal ovdb2 is wider that the width of the first pulse signal ovdb1, when the control signal REF is inputted to high level, the wider width of the second pulse signal ovdb2 is outputted as the pulse signal ovdb of the pulse generator 210. As a result, the external voltage VDD is supplied to the peripheral circuit 230 in FIG. 2 via the switching device P201 in FIG. 2 for a long time, according to the pulse signal ovdb. On the other hand, when the control signal REF is inputted to low level, the narrower width of the first pulse signal ovdb1 is outputted as the pulse signal ovdb of the pulse generator 210. And then, the external voltage VDD is supplied to the peripheral circuit 230 in FIG. 2 via the switching device P201 in FIG. 2 for a short time, according to the pulse signal ovdb.

By the aforementioned operation, the power supply apparatus in the semiconductor memory device of the present invention is available to control the overdriving time by means of values of current consumption. As well, with inputting the refresh operation signal as the control signal REF, the short overdriving period is set to in the general operating mode of the DRAM, and the long overdriving period is set to in the refresh operating mode which the current consumption is remarkably increased. Accordingly, the circuit can be stabilized to operate.

Figure 4:
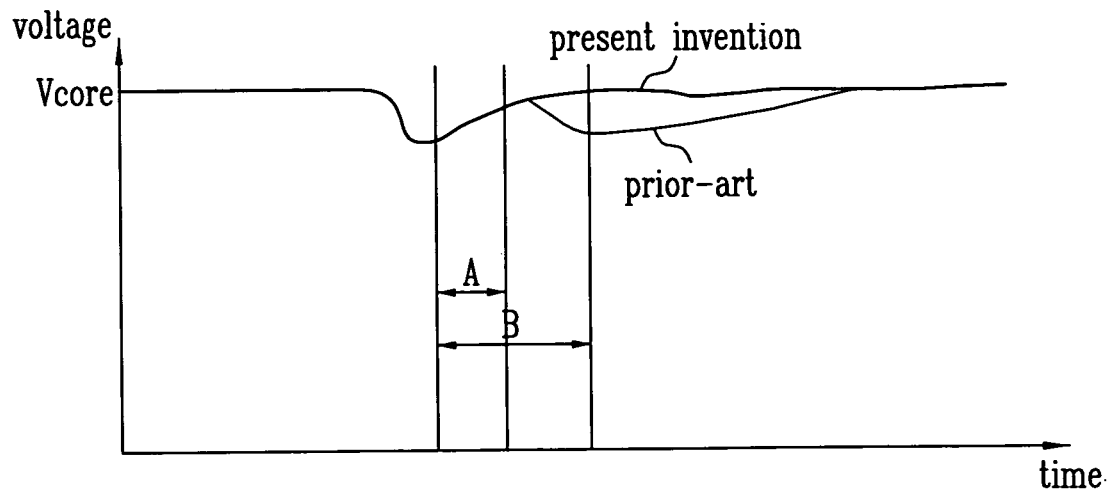
FIG. 4 is a graph for comparing characteristics of voltage supplied to peripheral circuits.

FIG. 4 is a characteristic graph for comparing characteristics of voltage supplied to peripheral circuits.

Referring to FIG. 4, when the overdriving period A is set to in a short section as in the conventional art, it takes long time to rise up the internal voltage Vcore which is supplied to the peripheral circuit to a target level, and thus the internal voltage Vcore isn't supplied in a stable mode. However, if the overdriving period B is set to in a long section according to values of power consumption as in the present invention, it takes short time to rise up the internal voltage Vcore to a target level, and thus the internal voltage Vcore is supplied in a stable mode.

As aforementioned, the present invention supplies the external voltage of high level at the beginning operation when the current consumption is remarkably increased, and then supplies the internal voltage of the target level after a predetermined time. In this case, when the current consumption is increased more in condition of selecting plural pairs of bitlines than in condition of selecting a pair of bitlines, the external voltage is supplied for a longer time. Therefore, as the present invention comprises the relatively small number of internal voltage generators and operates them, it can improve reliability of the circuit operation.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of supplying power in a semiconductor memory device, comprising steps of:
    deciding an operating mode between a first operating mode requiring relatively more current consumption and a second operating mode requiring relatively less current consumption according to a control signal;
    applying an external voltage for a first predetermined supplying time and applying an internal voltage after the first predetermined supplying time in case of the operating mode requiring relatively more current consumption; and
    applying the external voltage for a second predetermined supplying time and applying the internal voltage after the second predetermined supplying time in case of the operating mode requiring relatively low current consumption,
    wherein the external voltage is higher than the internal voltage, and the first predetermined supplying time is longer than the second predetermined supplying time.

* * * * *